United States Patent [19]

Easton et al.

[11] Patent Number: 4,874,634

[45] Date of Patent: Oct. 17, 1989

[54] VAPOR PHASE DEPOSITION OF CADMIUM AND MERCURY TELLURIDE FOR ELECTRONIC DEVICE MANUFACTURE

[75] Inventors: Brian C. Easton, Reigate; Peter A. C. Whiffin, Horsham, both of England

[73] Assignee: U.S. Philips Corp., New York, N.Y.

[21] Appl. No.: 181,280

[22] Filed: Apr. 14, 1988

[30] Foreign Application Priority Data

Apr. 16, 1987 [GB] United Kingdom ................. 8709185

[51] Int. Cl.⁴ ............................................. B05D 3/06
[52] U.S. Cl. .................................... 427/54.1; 427/12; 427/55; 427/255.2; 427/255.7
[58] Field of Search ................ 427/54.1, 55, 12, 255.2, 427/255.7; 118/620, 723; 428/689, 938; 437/225, 234

[56] References Cited

U.S. PATENT DOCUMENTS

| | | | |
|---|---|---|---|
| 3,218,203 | 11/1965 | Ruehrwein | 427/255.2 |
| 3,218,204 | 11/1965 | Ruehrwein | 427/255.2 |
| 3,224,912 | 12/1965 | Ruehrwein | 427/255.2 |
| 3,664,866 | 5/1972 | Manasevity | 427/255.2 |
| 4,015,558 | 4/1977 | Small et al. | 118/620 |
| 4,115,163 | 9/1978 | Gorina et al. | |
| 4,568,397 | 2/1986 | Hoke et al. | |
| 4,650,539 | 3/1987 | Irvine et al. | 427/255.2 |
| 4,664,057 | 5/1987 | Hemmati | 118/620 |

FOREIGN PATENT DOCUMENTS

| | | | |
|---|---|---|---|
| 0135344 | 3/1985 | European Pat. Off. | |
| 0140625 | 5/1985 | European Pat. Off. | |
| 86/02951 | 5/1986 | PCT Int'l Appl. | 427/54.1 |
| 1498459 | 1/1975 | United Kingdom | |
| 2146663 | 4/1985 | United Kingdom | 427/255.2 |
| 2155357 | 9/1985 | United Kingdom | |
| 2156857 | 10/1985 | United Kingdom | |

Primary Examiner—Stanley Silverman
Attorney, Agent, or Firm—William L. Botjer

[57] ABSTRACT

Alternate layers of CdTe and HgTe are deposited on a substrate in a reaction zone inside a reactor vessel using a method involving the steps of (a) passing a gas stream containing a volatile tellurium compound ($Et_2Te$) over the substrate while maintaining an atmosphere of mercury vapour in the reaction zone, and (b) switching on and off a separate supply of a volatile cadium compound ($Me_2Cd$) to the reaction zone so as to deposit CdTe when the separate supply is on and to deposit HgTe when the separate supply is off (O). The surface of the substrate is irradiated with electromagnetic radiation (UV) the intensity of which is switched during the deposition. The irradiation intensity (UV) is reduced, possibly even to zero (O), when the supply of the volatile cadium compound ($Me_2Cd$) is switched on. When the cadium supply ($Me_2Cd$) is switched off (O), the irradiation intensity (UV) is increased to promote photodissociation of the volatile tellurium compound ($Et_2Te$) by the electromagnetic radiation (UV). This permits the layers to be grown at a low substrate temperature, while avoiding premature nucleation of CdTe in the gas stream. The switching of the radiation intensity (UV) may be effected using a mechanical shutter to switch off (O) the irradiation (UV) or using an adjustable iris or movable neutral-density filter to reduce the UV intensity. The alternate layers may be interdiffused during growth to form a cadmium mercury telluride layer for an electronic device, for example an infrared detector or a bipolar transistor. Alternatively, the alternate HgTe and CdTe layers may be preserved in the final device, for example as a "superlattice".

9 Claims, 2 Drawing Sheets

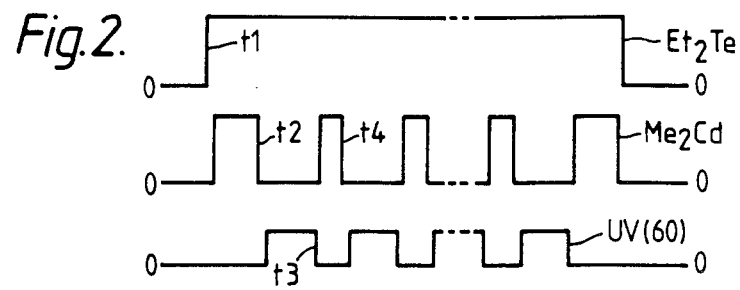
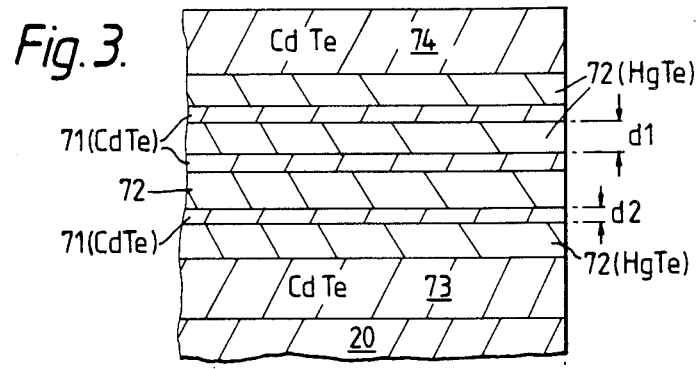
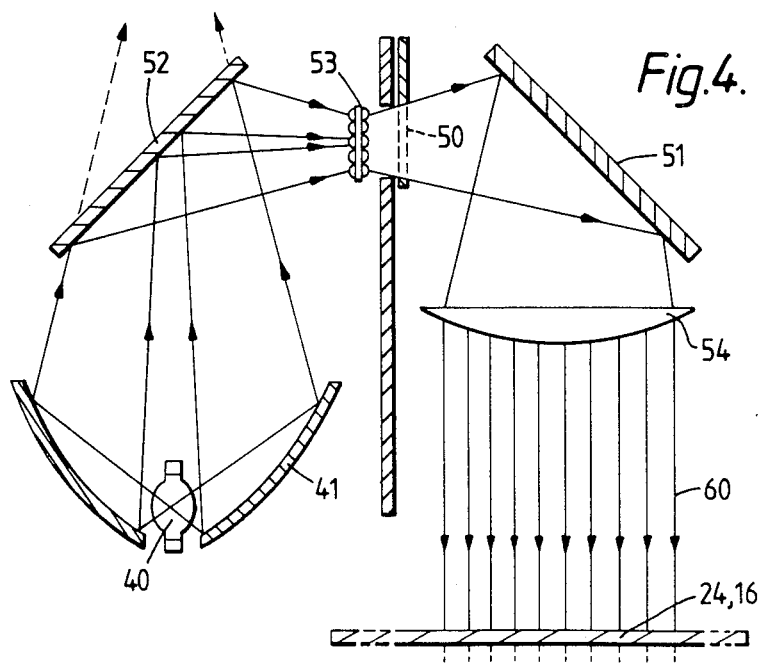

VAPOR PHASE DEPOSITION OF CADMIUM AND MERCURY TELLURIDE FOR ELECTRONIC DEVICE MANUFACTURE

BACKGROUND OF THE INVENTION

The present invention relates to methods of depositing alternate layers of cadmium telluride and mercury telluride in the manufacture of an electronic device, particularly but not exclusively of cadmium mercury telluride. Such electronic devices may be, for example, infrared detectors or phototransistors.

Published United Kingdom patent application GB-A-2 146 663 discloses, in the manufacture of an electronic device such as an infrared detector of cadmium mercury telluride, a method of depositing alternate layers of cadmium telluride and mercury telluride on a substrate in a reaction zone inside a reactor vessel. The method comprises the steps of (a) passing a gas stream containing a volatile tellurium compound over the substrate while maintaning an atmosphere of mercury vapour in the reaction zone, and (b) switching on and off a supply of a volatile cadmium compound to the reaction zone so as to deposit cadmium telluride when the supply is on and to deposit mercury telluride when the supply is off. The whole contents of GB-A-2 146 663 are hereby incorporated as reference material into the present specification.

During the steps (a) and (b) in the method of GB-A-2 146 663, the substrate is heated to a temperature (preferably in the range 400° to 430° C., degrees Celsius) at which the cadmium telluride and mercury telluride interdiffuse during growth of the alternate layers on the substrate to form a single layer of cadmium mercury telluride. The composition (x) of the $Cd_xHg_{1-x}Te$ thus formed is determined by the relative thicknesses of the CdTe layer(s) and the HgTe layer(s). In principle, this method permits the growth conditions to be optimised for each CdTe and HgTe layer, while simply switching on and off the voltatile cadmium compound supply.

Published PCT international patent application WO-A-86/02951 discloses a modification of the method of GB-A-2 146 663 in which the surface of the substrate is uniformally irradiated with electromagnetic radiation (particularly ultra-violet light) during the deposition of all the CdTe and HgTe layers. This provides photolytic decomposition of the volatile Cd and Te compounds so that growth of the layers on the substrate can occur at lower substrate temperatures, for example below about 350° C. The whole contents of WO-A-86/02951 are hereby incorporated as reference material in the present specification.

It is found that, at least when the Te and Cd compounds are alkyls and when using a carrier gas of hydrogen, the photodecomposition of the alkyls in this manner results in cadmium telluride being deposited as a dust of no practical use. The cause appears to be a strong vapour phase photolytic reaction of the cadmium alkyl (for example dimethyl cadmium) which is assisted by the hydrogen and which results in the homogeneous nucleation of CdTe particles. This problem is mitigated in the method of WO-A-86/02951 by using a carrier gas composed at least 50% (and preferably more than 95%) of an inert gas, for example helium. Furthermore, as the photodecomposition of dimethyl cadmium is much more efficient than that of diethyl telluride, the concentration of the cadmium alkyl in the gas stream is preferably much less than that of the tellurium alkyl.

SUMMARY OF THE INVENTION

The present invention provides a different variation in a method of depositing alternate layers of cadmium telluride and mercury telluride, permitting better optimisation of the individual growth conditions for the two layers by appropriately switching the intensity of the irradiation during the deposition. The alternate layers may be interdiffused to form a layer of cadmium mercury telluride for the device, or they may be retained as a so-called "superlattice" in the device.

According to the present invention, there is provided, in the manufacture of an electronic device, a method of depositing alternate layers of cadmium telluride and mercury telluride on a substrate in a reaction zone inside a reactor vessel, comprising the steps of (a) passing a gas stream containing a volatile tellurium compound over the substrate while maintaining an atmosphere of mercury vapour in the reaction zone, and (b) switching on and off a supply of a volatile cadmium compound to the reaction zone so as to deposit cadmium telluride when the supply is on and to deposit mercury telluride when the supply is off, the surface of the substrate being irradiated with electromagnetic radiation during the deposition, which method is characterised in that the irradiation intensity is reduced when the supply of the volatile cadmium compound is switched on, and that, when said supply is switched off, the irradiation intensity is increased to promote photodissociation of the volatile tellurium compound by the electromagnetic radiation.

By thus switching the intensity of irradiation of the substrate during the deposition, a slow reaction rate for growth of the mercury telluride layer(s) from the mercury vapour and volatile tellurium compound can be increased, while suppressing a more efficient photodecomposition of the volatile cadmium compound by reducing (possibly even to zero) the irradiation during the growth of the cadmium telluride layer(s). Thus, when the supply of the volatile cadmium compound is switched on, the irradiation may simply be switched off, for example using a mechanical shutter. The deposition of alternate layers in accordance with the invention may even be effected using a carrier gas stream of hydrogen which is less expensive than helium and easier to purify. Furthermore, by switching the intensity of the irradiation in accordance with the invention, less of a restriction is placed on the concentration of the cadmium compound in the gas stream (even with dimethyl cadmium), and a stable gas flow system with a constant flow rate during the deposition of the alternate layers can be used. Such a gas flow system is described in published United Kingdom patent application GB-A-2 156 857, the whole contents of which are hereby incorporated as background material in the present specification. Both the switching on and off of the supply of the volatile cadmium compound and the switching of the intensity of the irradiation can be controlled in a simple manner by a common output signal from a computer which may be used to control the temperatures and gas flows in the deposition system.

BRIEF DESCRIPTION OF THE DRAWING

These and other features in accordance with the present invention will be illustrated further in embodiments of the invention now to be described, by way of example, with reference to the accompanying diagrammatic drawings, in which:

FIG. 2 is a representation of changes with time in gas flows and irradiation, which may be adopted with the apparatus of FIG. 1 in a method in accordance with the present invention, FIG. 3 is a cross-sectional view of part of a layer structure deposited on a substrate using such a method in accordance with the invention, and FIG. 4 is a representation of a sectional view through a shuttered ultraviolet radiation source suitable for use in the apparatus of FIG. 1 and for the growth procedures of FIGS. 2 and 3.

DETAILED DESCRIPTION OF THE PREFERRED EMBODIMENT

Figure 1:
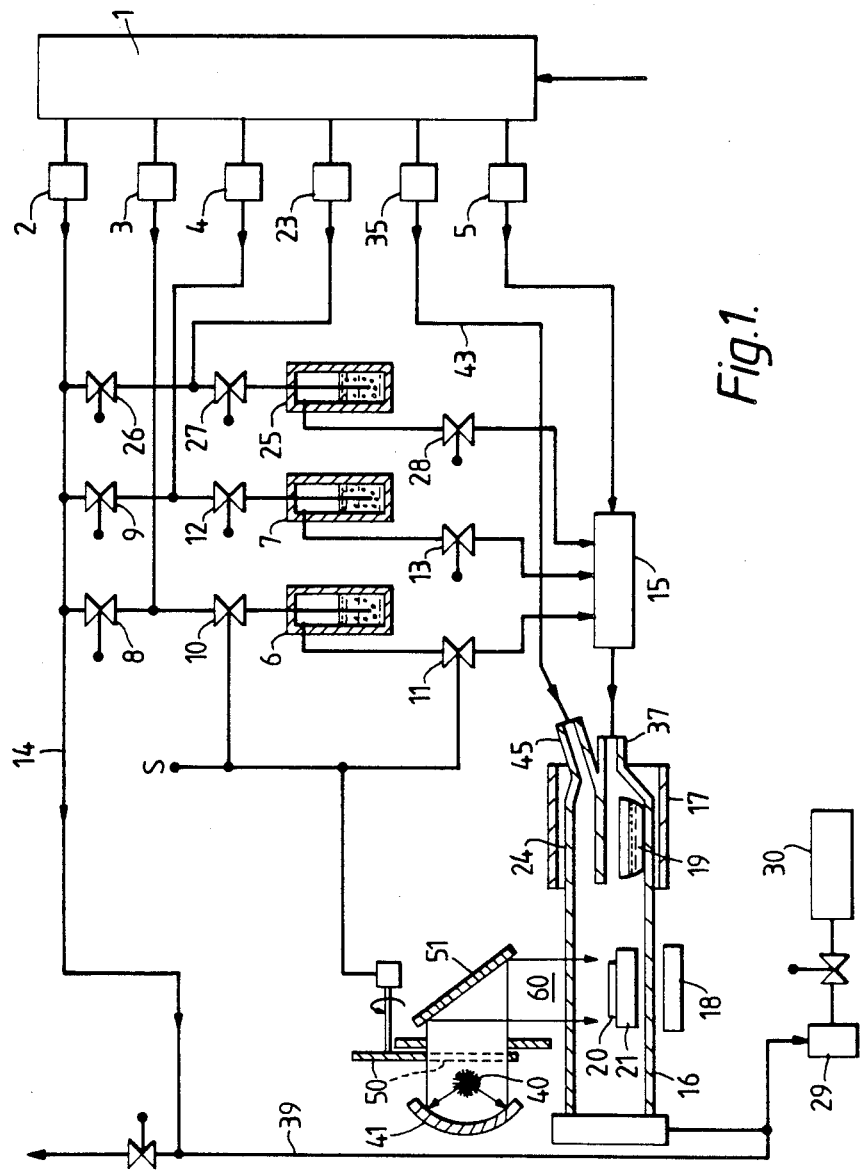
FIG. 1 is a representation of a longitudinal section through a vapour-phase epitaxial reactor using photodecomposition in a method in accordance with the present invention, together with its gas supply system.

The apparatus illustrated in FIG. 1 is a modification of that shown and described in WO-A-86/02951 and using the same reference signs for corresponding or similar parts as in the apparatus of WO-A-86/02951.

A manifold 1 maintains a supply of a carrier gas for mass flow controllers 2,3,5,23 and 35. Whereas for the arrangement of WO-A-86/02951 the carrier gas was required to be (at least predominantly) an inert gas such as helium, hydrogen may be used as the carrier gas in a process in accordance with the present invention. Preferably the gas fed to the manifold 1 is high purity hydrogen which has been purified by diffusion through palladium. The flow controller 2 supplies hydrogen to a bypass line 14 connected to an exhaust line 39. Flow controllers 3, 4 and 23 supply hydrogen to respective bubblers 6, 7 and 25. Bubbler 6 contains an alkyl of cadmium such as dimethyl cadmium, whereas bubbler 7 contains an alkyl of tellurium such as diethyl telluride. Bubbler 25 may, for example, contain a volatile compound of a dopant for cadmium mercury telluride. Hydrogen flow from the controllers 3, 4 and 23 can be diverted via respective valves 8, 9 and 26 to the bypass line 14 or through respective valves (10,11) and (12,13) and (27,28). Thus enables the flows from the bubblers 6, 7 and 25 to be turned on and off. Hydrogen bubbling through the liquid alkyl in the bubblers 6 and 7 becomes saturated with alkyl vapours and these separate gas streams of the cadmium and tellurium alkyls (possibly with dopant from bubbler 25) are mixed in a mixer 15 with a further dilution flow of hydrogen supplied by the flow controller 5. The gas stream of hydrogen plus alkyls leaving the mixer 15 is passed into a lower inlet port 37 of a reactor vessel 16.

The part of the vessel 16 near the inlet port 37 contains a bath 19 of mercury and is heated by a surface 17 to provide an atmosphere of mercury vapour inside the reactor vessel 16. In a reaction zone further along the vessel 16, a susceptor 21 carries a substrate 20 on which alternate layers of CdTe and HgTe are to be deposited. A heater 18 which is shown located outside the vessel 16 heats the susceptor 21 so as to heat the substrate 20. The exhaust gas stream is extracted via the line 39. A vacuum pump 30 is connected to the vessel 16 via a cold trap 29 for initial purging of the vessel 16.

An ultraviolet lamp 40 located outside the reactor vessel 16 provides broad-band ultra-violet radiation which is focussed by one or more reflectors 41 and 51 into the reaction zone adjacent to the upper surface of the substrate 20. Between the lamp 40 and the substrate 20, some form of switching means 50 (for example a mechanical shutter, variable iris aperture, or movable neutral-density filter) is provided for switching the irradiation intensity of the ultraviolet light 60 in the reaction zone during the deposition of the alternate CdTe and HgTe layer structure, in accordance with the present invention.

A stream of hydrogen via a line 43 from the controller 35 is supplied to the vessel 16 via a second inlet port 45 which extends over and is separated from the mercury bath 19. This gas stream keeps the upper wall 24 of the vessel above the substrate 20 free from deposits during the photodeposition process. It is through this upper wall 24 that the ultraviolet radiation 60 reaches the reaction zone.

Using this apparatus of FIG. 1, thin alternate layers of CdTe and HgTe (references 71 and 72 respectively in FIG. 3) are deposited on the substrate 20 in the reaction zone. The method comprises the steps of (a) passing the gas stream containing the alkyl of tellurium from the bubbler 7 over the substrate 20 from the mixer 15 while maintaining the atmosphere of mercury vapour in the reaction zone from the bath 19, and (b) switching on and off the supply of the cadmium alkyl to the reaction zone (by switching the values (10,11) and 8) so as to deposit cadmium telluride 71 when the cadmium supply is on (with valves 10 and 11 open and with valve 8 shut) and to deposit mercury telluride 72 when the cadmium supply is off (with valves 10 and 11 shut and with valve 8 open).

In accordance with the present invention, the intensity of the ultraviolet irradiation 60 is reduced when the cadmium supply is switched on (by opening valves 10 and 11), whereas, when the cadmium supply is switched off (by shutting valves 10 and 11), the intensity of the irradiation 60 is increased to promote photodissociation of the tellurium alkyl by the ultraviolet radiation 60. FIG. 2 illustrates a particular embodiment in which the ultraviolet radiation 60 is switched on and off so that the irradiation only occurs during the growth of the mercury telluride layers 72. In this case the switching means 60 may be a shutter. The base lines (reference 0) for the intensity of the irradiation (UV), tellurium alkyl supply ($Et_2Te$), and cadmium alkyl supply ($Me_2Cd$) represent the situation in which these parameters are off.

Preferably the movement of the shutter 50 is controlled by an output signal S from a computer which is used to control the gas flows and temperatures in the deposition system. Thus, a common output signal S from the computer control unit may be applied to control lines as illustrated in FIG. 1 so as to control the switching of both the shutter 50 and the gas-flow valves 10 and 11 for the cadmium alkyl supply to the reactor vessel 16.

A particular growth procedure for one particular example of a deposited layer structure will now be described with reference to FIGS. 2 and 3. The substrate 20 may be, for example, monocrystalline cadmium telluride, or any other appropriate substrate material described in WO-A-86/02951 and GB-A-2 146 663. The substrate 20 is cleaned, placed on the susceptor 21 in the reactor vessel 16 and heated to the desired temperature for the deposition, normally below 400° C. The mercury bath 19 is normally heated to a lower temperature than the substrate 20.

By switching open the valves 12 and 13, at time t1 the volatile tellurium compound $Et_2Te$ is introduced into the hydrogen stream which is passed over the substrate 20 from the mixer 15, the hydrogen flowing through controllers 4, 5 and 35. By switching open the valves 10 and 11, the volatile cadmium compound Me₂Cd is also introduced into the hydrogen stream and is maintained for a sufficient time (until t2) that the first layer deposited on the surface of the substrate 20 in this particular example is a thick, buffer layer 73 of cadmium telluride. This cadmium telluride layer 73 is grown without irradiation of the substrate surface by the ultraviolet radiation 60, i.e. the mechanical shutter 50 is interrupting the ultraviolet light beam generated by the lamp 40 and reflector 41. The cadmium telluride is formed by reaction of the cadmium alkyl with the tellurium alkyl at the heated surface of the substrate 20, for example as described in GB-A-2 146 663.

At time t2 the cadmium supply is switched off by shutting valves 10 and 11, and the ultraviolet irradiation 60 is switched on by opening the shutter 50. The material now deposited is a layer 72 of mercury telluride which is formed by reaction of the tellurium alkyl with the mercury vapour at the heated substrate surface (actually the upper surface of layer 73). The ultraviolet radiation 60 promotes photodissociation of the tellurium alkyl at the heated surface, for example as described in WO-A-86/02951. The switching on of the irradiation 60 need not be simultaneous with the switching off of the cadmium supply, but may be slightly delayed (for example for several seconds) until the composition of the gas stream is stabilised after the switching off of the cadmium supply. This can be effected easily with separate control lines to the shutter 50 and to the valves 10 and 11. The irradiation 60 is maintained on and the cadmium supply off for a sufficient time until a desired thickness d1 of mercury telluride is deposited.

Then at time t3 the irradiation 60 is switched off, and the cadmium supply is switched on until (at time t4) a cadmium telluride layer 71 having a desired thickness d2 is deposited. So as to avoid any photodissociation of the cadmium alkyl it may be preferable to delay slightly the switching on of the cadmium supply, rather than it being simultaneous with the switching off of the irradiation 60.

The sequence is then repeated to grow further alternate mercury telluride and cadmium telluride layers 72 and 71 until the desired total layer structure thickness is achieved. As illustrated in the particular example of FIGS. 2 and 3, the last layer deposited may be a thick, passivating layer 74 of cadmium telluride, this layer 74 being grown with the radiation 60 switched off.

During this growth sequence the thin alternate CdTe and HgTe layers 71 and 72 may interdiffuse at the growth temperature (below 400° C.) to which the substrate 20 is heated, so as to form a substantially homogeneous layer of cadmium mercury telluride between the buffer layer 73 and passivating layer 74. As described in GB-A-2 146 663, the cadmium component x of the composition $Cd_xHg_{1-x}Te$ so formed is given by:

$x = d2/(d1+d2)$.

The combined thickness (d1+d2) of one CdTe layer 71 and one HgTe layer 72 is normally less than 0.5 μm (micrometers), and in one typical example may be, for example 0.2 μm (200 nm). In this case, for cadmium mercury telluride having an x value of 0.3, d1 is 140 nm and d2 is 60 nm. In one example of a growth sequence in accordance with the present invention and with a substrate temperature of about 350° C., the growth rate for CdTe without the irradiation 60 is about 150 nm per minute, whereas the growth rate for HgTe with the irradiation 60 is about 35 nm per minute. Under these conditiions, the cadmium supply needs to be switched on for approximately 25 seconds to grow a 60 nm thick layer 71 of CdTe, and the irradiation 60 needs to be switched on for approximately 4 minutes (with the cadmium supply switched off) in order to grow a 140 nm thick HgTe layer 72.

It should be noted that without the irradiation 60 the growth rate for HgTe is virtually nil. When switched on, the ultraviolet radiation 60 seems to effect a photosensitisation of the heated substrate surface which together with absorption in the tellurium alkyl and the temperature of the substrate surface provides decomposition of the tellurium alkyl and its combination with the mercury from the atmosphere. In the absence of the ultraviolet irradiation 60, satisfactory deposition of the CdTe layers 71 is obtained without premature nucleation in the hydrogen gas stream.

The cadmium mercury telluride layer thus formed in accordance with the present invention is then subjected to further fabrication steps in order to complete the manufacture of the desired electronic device. Such further fabrication steps may be as described in GB-A-2 146 663. Thus, for example, they may involve forming a p-n junction in the cadmium mercury telluride layer, etching the layer to produce a desired shape for the device body and depositing metal electrodes to contact regions of the device body. In this way there may be formed, for example, a p-n photodiode of cadmium mercury telluride as an infrared detector element, or, for example an n-p-n bipolar transistor of cadmium mercury telluride.

Various known ultraviolet lamps are suitable for use with the invention. In a typical example, deep ultraviolet having wavelengths in the range 200 to 300 nm may be used for the irradiation 60, and it is normally preferable to employ broad-band radiation 60 to avoid the undesirable situation where the components in the gas stream (particularly the mercury vapour) are resonant with the ultraviolet radiation so preventing the radiation from reaching the substrate 20. Satisfactory irradiation can be effected using high pressure mercury of mercury(xenon) lamps. In a particular example, an arrangement such as that illustrated in FIG. 4 may be used.

As illustrated in FIG. 4, the radiation emitted by a mercury(xenon) lamp 40 is concentrated into a beam by an ellipsoidal reflector 41 and converges onto a dichroic spectral mirror 52. The mercury(xenon) lamp 40 which is preferably operated at a high electrical power, for example 1 kW, emits unwanted wavelengths (for example, in the infrared) as well as the desired broad-band ultraviolet wavelengths. The dichroic mirror 52 reflects only the desired ultraviolet wavelengths onto an optical integrator 53 and transmits the unwanted wavelengths out of the path of the beam. In this way the infrared is removed from the emitted radiation before the radiation 60 reaches the substrate 20 (thereby avoiding further heating of the substrate 20) and before the radiation reaches the shutter 50 (thereby avoiding heating, and possibly distorting, the shutter 50). The integrator 53 which may comprise arrays of so-called "fly-eye" lenses produces a diverging beam of uniform intensity directed at the mirror 51. The mirror 51 reflects the beam to a collimating lens 54 by which the ultraviolet radiation 60 is collimated.

The shutter 50 may be incorporated between the collimating lens 54 and the upper wall 24 of the reactor vessel 16, or between the mirror 51 and the lens 54. FIG. 4 illustrates an advantageous arrangement in which the shutter 50 is in the proximity of the integrator 53 where the radiation beam is of small cross-section, for example at an exit from an enclosure for the lamp 40. The shutter 50 may be actuated by a solenoid which can be controlled by the computer used to control the temperatures and gas flows in the deposition system. An ultraviolet exposure illuminator as marketed (for photoresist exposure) by ORIEL Corp., of Long Beach Boulevard, Stratford, Conn., U.S.A., may be used as the basis of an ultraviolet irradiation arrangement of the type illustrated in FIG. 4. A condenser lens may be added in the path of the beam 60 after the collimating lens 54, in order to obtain a high intensity of irradiation 60 for the HgTe deposition. The shutter 50 of the illuminator is used to switch off the irradiation 60 during the CdTe deposition.

However, instead of using a shutter 50 and switching off the irradiation 60, the intensity of the irradiation 60 may be attenuated during the CdTe growth. Thus, by means of a different switching means 50, the intensity of the irradiation 60 may be switched to a low level when the cadmium alkyl supply is switched on and to a high level when the cadmium alkyl supply is switched off. Such an attenuation in the intensity of the irradiation 60 may be achieved using, for example an appropriately positioned adjustable iris or a movable neutral-density filter as the switching means 50, both of which are still preferably controlled by an output signal from a computer controlling the gas flows. When using a low level of ultraviolet irradiation 60 for the cadmium telluride growth, the growth of the alternate CdTe and HgTe layers may be performed with lower temperatures for the substrate 20, for example about 300° C. Furthermore, instead of interposing a switching means 50 between the lamp 40 and the substrate 20, arrangements are also possible with some lamps 40 in which the power supply to the lamp itself may be switched in order to switch the intensity of its ultraviolet light output.

Instead of mixing the separate cadmium alkyl supply from the bubbler 6 with the main gas stream in a mixer 15, it may be injected directly into the reactor vessel 16 via a narrow injection tube which opens into the main gas stream at a location between the mercury bath 19 and the substrate 20. An example of such an injection tube for the cadmium supply is disclosed in GB-A-2 156 857. Furthermore, the bubblers 6, 7 and 25 may be fitted with three-way solenoid valves (instead of two-way valves 10,11,12,13, 27 and 28) and form part of a gas flow system as disclosed in GB-A-2 156 857, in which system the gas streams into the reactor vessel may be diverted either through or past the bubblers. A stable gas flow system with a constant flow rate during deposition of the alternate layers 71 and 72 may thus be used.

Furthermore, different alkyls may be used, or instead of using alkyls, other volatile cadmium and/or tellurium compounds may be used, for example hydrides. It is also possible to supply the mercury atmosphere to the reaction zone of the reactor vessel 16 in the form of a gas stream containing a mercury alkyl, instead of from a heated bath 19.

Although embodiments have been described in which thin, alternate CdTe and HgTe layers 71 and 72 are interdiffused during growth to form a single cadmium mercury telluride layer, the present invention may also be used to form layer structures in which the interdiffusion is minimised and in which alternate CdTe and HgTe layers are preserved in a region of the final device structure. Thus, a so-called "superlattice" device may be formed using a method in accordance with the invention.

From reading the present disclosure, other modifications will be apparent to persons skilled in the art. Such modifications may involve other features which are already known in the design and use of vapour-phase deposition systems and processes and irradiation systems and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation or modification thereof which would be obvious to persons skilled in the art, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. In the manufacture of an electronic device, a method of depositing alternate layers of cadmium telluride and mercury telluride on a substrate in a reaction zone inside a reactor vessel, comprising the steps of (a) passing a gas stream containing a volatile tellurium compound over the substrate while maintaining an atmosphere of mercury vapour in the reaction zone, and (b) periodically switching on and off a supply of a volatile cadmium compound to the reaction zone so as to deposit cadmium telluride when the supply is on and to deposit mercury telluride when the supply is off, the surface of the substrate being irradiated with electromagnetic radiation during the deposition, characterized by periodically switching the intensity of the irradiation during the deposition in such manner that the irradiation intensity is reduced to reduce photodissociation of the volatile compounds when the supply of the volatile cadmium compound is switched on, and that, when said supply is switched off, the irradiation intensity is increased to promote photodissociation of the volatile tellurium compound by the electromagnetic radiation.

2. A method as claimed in claim 1, further characterised in that, when the supply of the volatile cadmium compound is switched on, the irradiation is switched off thereby reducing its intensity to zero.

3. A method as claimed in claim 2, further characterised in that the irradiation is effected using an ultra-violet lamp and is switched on and off by means of a mechanical shutter between the lamp and the substrate.

4. A method as claimed in claim 1, further characterised in that the irradiation is effected using a lamp which emits infrared as well as ultraviolet radiation, the infrared being removed from the emitted radiation before irradiating the substrate.

5. A method as claimed in claim 4, further characterised in that the infrared is removed from the emitted radiation before the radiation reaches a switching means which is used to reduce the irradiation intensity when the supply of the cadmium compound is switched on.

6. A method as claimed in claim 1, further characterised in that the substrate is heated to a temperature below 400° C. during the steps (a) and (b), at which temperature the cadmium telluride and mercury telluride interdiffuse during growth of the alternate layers on the substrate to form a layer of cadmium mercury telluride.

7. A method as claimed in claim 1, further characterised in that the first layer deposited on the surface of the substrate is a buffer layer of cadmium telluride, grown without irradiation of the surface by the electromagnetic radiation.

8. A method as claimed in claim 1, further characterised in that the last layer deposited is a passivating layer of cadmium telluride, grown with the irradiation switched off.

9. A method as claimed in claim 1, further characterised in that the gas stream comprises hydrogen as a carrier gas for the volatile tellurium compound.

* * * * *